(12) United States Patent
Park et al.

(10) Patent No.: US 6,990,134 B2
(45) Date of Patent: Jan. 24, 2006

(54) GAN SERIES SURFACE-EMITTING LASER DIODE HAVING SPACER FOR EFFECTIVE DIFFUSION OF HOLES BETWEEN P-TYPE ELECTRODE AND ACTIVE LAYER, AND METHOD FOR MANUFACTURING THE SAME

(75) Inventors: Yong-jo Park, Kyungki-do (KR); Kyoung-ho Ha, Seoul (KR); Heon-su Jeon, Kyungki-do (KR); Si-hyun Park, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 67 days.

(21) Appl. No.: 10/816,822

(22) Filed: Apr. 5, 2004

(65) Prior Publication Data

US 2004/0190581 A1    Sep. 30, 2004

Related U.S. Application Data

(62) Division of application No. 10/055,999, filed on Jan. 28, 2002, now Pat. No. 6,754,245.

(30) Foreign Application Priority Data

Feb. 2, 2001 (KR) ................................ 2001-5065

(51) Int. Cl.
*H01S 5/00* (2006.01)

(52) U.S. Cl. ............................... 372/50.11; 372/43.01; 372/50.23; 372/50.1; 372/103; 372/92

(58) Field of Classification Search ............ 372/43–50, 372/92, 103
See application file for complete search history.

(56) References Cited

U.S. PATENT DOCUMENTS 5,034,958 A    7/1991    Kwon et al.

(Continued)

FOREIGN PATENT DOCUMENTS

| EP | 0 651 477 A1 | 5/1995 |
| EP | 0 918 384 A2 | 5/1999 |
| EP | 0 918 384 A3 | 3/2000 |
| WO | 97/40558 | 10/1997 |

OTHER PUBLICATIONS

European Search Report issued by the European Patent Office on Jul. 6, 2004 in corresponding application EP 02250606.7.

(Continued)

*Primary Examiner*—Minsun Oh Harvey
*Assistant Examiner*—Delma R. Flores-Ruiz
(74) *Attorney, Agent, or Firm*—Buchanan Ingersoll PC

(57) ABSTRACT

A GaN series surface-emitting laser diode and a method for manufacturing the same are provided. The GaN series surface-emitting laser diode includes: an active layer; p-type and n-type material layers on the opposite sides of the active layer; a first-distributed Bragg reflector (DBR) layer formed on the n-type material layer; an n-type electrode connected to the active layer through the n-type material layer such that voltage is applied to the active layer for lasing; a spacer formed on the p-type material layer with a laser output window in a portion aligned with the first DBR layer, the spacer being thick enough to enable holes to effectively migrate to a center portion of the active layer; a second DBR layer formed on the laser output window; and a p-type electrode connected to the active layer through the p-type material layer such that voltage is applied to the active layer for lasing. The laser output window is shaped such that diffraction of a laser beam caused by the formation of the spacer can be compensated for.

17 Claims, 12 Drawing Sheets

U.S. PATENT DOCUMENTS

| | | |
|---|---|---|
| 5,245,622 A | 9/1993 | Jewell et al. |
| 5,513,202 A | 4/1996 | Kobayashi et al. |
| 5,633,527 A | 5/1997 | Lear |
| 5,818,862 A | 10/1998 | Salet |
| 5,822,347 A * | 10/1998 | Yokogawa et al. ...... 372/45.01 |
| 5,956,362 A * | 9/1999 | Yokogawa et al. ...... 372/46.01 |
| 6,238,944 B1 | 5/2001 | Floyd |
| 6,343,090 B1 * | 1/2002 | Yoo et al. ..................... 372/96 |
| 6,529,541 B1 | 3/2003 | Ueki et al. |
| 6,534,331 B2 | 3/2003 | Liao et al. |
| 6,661,829 B2 * | 12/2003 | Jeon ............................. 372/96 |
| 6,754,245 B2 * | 6/2004 | Park et al. ................ 372/50.11 |
| 6,778,582 B1 * | 8/2004 | Mooradian ................... 372/97 |
| 2003/0012231 A1 * | 1/2003 | Tayebati et al. .............. 372/20 |
| 2003/0043871 A1 * | 3/2003 | Ueda et al. ................... 372/45 |

OTHER PUBLICATIONS

Strzelecka et al., "Monolithic integration of vertical-cavity laser diodes with refractive GaAs microlenses," Electronics Letters, vol. 31 No. 9, Apr. 27$^{th}$, 1995.

* cited by examiner

GAN SERIES SURFACE-EMITTING LASER DIODE HAVING SPACER FOR EFFECTIVE DIFFUSION OF HOLES BETWEEN P-TYPE ELECTRODE AND ACTIVE LAYER, AND METHOD FOR MANUFACTURING THE SAME

This application is a Divisional application of application Ser. No. 10/055,999, filed Jan. 28, 2002 U.S. Pat. No. 6,754,245, which is hereby incorporated by reference and claims priority to Patent Application Number 2001-5065 filed in Rep. of Korea on Feb. 2, 2001, herein incorporated by reference.

BACKGROUND OF THE INVENTION

1. Field of the Invention

The present invention relates to a surface-emitting laser diode formed of a GaN series III-V nitride compound and a method for manufacturing the same, and more particularly, toga GaN series surface-emitting laser diode having a spacer for effective diffusion of holes between a p-type electrode and an active layer, and a method for manufacturing the same.

2. Description of the Related Art

As shown in FIG. 1, a general GaN series surface-emitting laser diode includes an active layer 11 of an InGaN multi-quantum well (MQW) structure, a cavity 10 having an n-AlGaN carrier barrier layer 12 under the active layer 11 and a p-AlGaN carrier barrier layer 13 on the active layer 11, each of which confines carriers to the MQW structure, and distributed Bragg reflectors (DBRs) 20 and 30 which are formed on and underneath the cavity 10, respectively, with a reflectivity of about 99%.

DBRs are classified according to materials used for the DBRs: those formed of semiconductor materials having a similar lattice constant by epitaxial growth, and those formed of dielectric materials. The former has advantages in that current can be injected through semiconductor layers and the resultant material layers have good quality. In this case, suitable semiconductor materials should have bandgap energies greater than a desired oscillation wavelength so as not to cause absorption. A greater difference in refractive index between semiconductor materials for the two DBRs is preferable. For a GaN surface-emitting laser diode, as shown in FIG. 1, suitable semiconductor materials for the DBRs 20 and 30 include GaN (for layers indicated by reference numerals 22 and 32), AlN (for layers indicated by reference numerals 21 and 31), and AlGaN. Here, AlN and AlGaN including 30% or greater Al have too large bandgap energies. For this reason, when current is injected through DBRs formed of the materials, drive voltage becomes high, causing a heat related problem. In particular, AlGaN series materials have a small difference in refractive index, and thus multiple layers, e.g., tens of layer pairs, should be deposited for DBRs to satisfy a high-reflectivity requirement for laser oscillation. Due to narrow width of a high-reflectivity region, there is a difficulty in designing surface-emitting semiconductor laser diodes. In addition, laser oscillation requirements cannot be satisfied by slight deviations in thickness of the cavity 10 or slight changes in composition of the active layer 11.

For these reasons, dielectric materials, instead of semiconductor compounds, have been widely used. In this case, current cannot be directly injected through DBRs, so a separate electrode (not shown) is required around the DBRs. The mobility of electrons is high and a doping concentration in an n-type compound semiconductor layer between an n-type electrode and an active layer can be increased. Meanwhile, the mobility of holes is smaller than that of electrons and it is impossible to increase a doping concentration in a p-type compound semiconductor layer between a p-type electrode and the active layer. Thus, there is a problem in injecting current. In addition, due to an electrode being formed around a laser output window, it is not easy to effectively diffuse holes toward the center of the laser output window and thus it is difficult to provide effective laser oscillation characteristics.

SUMMARY OF THE INVENTION

To solve the above-described problems, it is a first object of the present invention to provide a GaN series surface-emitting laser diode in which a stable optical mode is ensured by effectively diffusing holes toward the center of a laser output window.

It is a second object of the present invention to provide a method for manufacturing a GaN series surface-emitting laser diode.

To achieve the first object of the present invention, there is provided a surface-emitting laser diode comprising: an active layer; p-type and n-type material layers on opposite sides of the active layer; a first distributed Bragg reflector (DBR) layer formed on the n-type material layer; an n-type electrode connected to the active layer through the n-type material layer such that voltage is applied to the active layer for lasing; a spacer formed on the p-type material layer with a laser output window in a portion aligned with the first DBR layer, the spacer being thick enough to enable holes to effectively migrate to a center portion of the active layer; a second BDR layer formed on the laser output window; and a p-type electrode connected to the active layer through the p-type material layer such that voltage is applied to the active layer for lasing. It is preferable that the laser output window is formed in a lens-like shape having a predetermined curvature to compensate for a drop in characteristics of a laser beam caused by the spacer. It is preferable that the spacer has a protrusion portion, and the laser output window is formed on the top of the protrusion portion. It is preferable that the p-type electrode is formed to surround the protrusion portion of the spacer. It is preferable that the spacer comprises: a first spacer formed on the p-type material layer; and a second spacer formed on the first spacer on which the laser output window is formed and around which the p-type electrode is formed. It is preferable that the second spacer has a protruded shape on which the laser output window is formed. It is preferable that one of the first and second spacers is a p-type doped substrate or an undoped substrate.

To achieve the second object of the present invention, there is provided a method for manufacturing a surface-emitting laser diode, the method comprising the steps of: (a) sequentially forming a p-type material layer for lasing, an active layer, and an n-type material layer for lasing on a substrate; (b) forming a first distributed Bragg reflector (DBR) on the n-type material layer, around which an n-type electrode is formed; (c) forming a laser output window on a bottom surface of the substrate, the laser output window having a shape suitable for compensating for a drop in characteristics of a laser beam caused by the presence of the substrate; (d) forming a p-type electrode on the bottom surface of the substrate to surround the laser output window; and (e) forming a second DBR layer on the laser output window;

Preferably, step (b) comprises: forming a conductive layer on the n-type material layer; forming a mask pattern on the conductive layer to expose a portion of the conductive layer in which the first DBR layer is to be formed; removing the portion of the conductive layer which is exposed through the mask pattern, using the mask pattern as an etch mask; forming the first DBR layer on a portion of the n-type material layer from which the conductive layer is removed; and removing the mask pattern.

Preferably, in step (c), the laser output window is formed in a convex lens-like shape having a predetermined curvature suitable for compensating for diffraction of the laser beam. Preferably, in processing the mask pattern, the mask pattern is processed into a convex lens-like shape by reflowing, the convex lens-like shape having a predetermined curvature suitable for compensating for diffraction of the laser beam.

It is preferable that the substrate is formed of multiple layers including a first substrate and a second substrate on the first substrate. In this case, etching the bottom surface of the substrate on which the processed mask pattern is formed is continued until the second substrate is exposed.

It is preferable that the substrate is a p-type doped substrate or an undoped substrate. It is preferable that one of the first and second substrates is a p-type doped substrate or an undoped substrate. It is preferable that the first substrate is formed as a substrate on which a gallium nitride based material is grown and the second substrate is formed as a p-type spacer.

The present invention also provides a method for manufacturing a surface-emitting laser diode, the method comprising the steps of: (a) sequentially forming on a substrate an n-type material layer for lasing, an active layer, a p-type material layer for lasing, and a p-type spacer; (b) forming a laser output window in a predetermined area of the p-type spacer; (c) forming a p-type electrode on the p-type spacer to surround the laser output window; (d) forming a first distributed Bragg reflector (DBR) layer on the laser output window; (e) removing the substrate; and (f) forming a second DBR layer on a predetermined portion of a bottom surface of the n-type material layer and forming an n-type electrode around the second DBR layer. It is preferable that the substrate is formed of an n-type substrate or a sapphire substrate. It is preferable that the laser output window is formed in a convex lens-like shape having a predetermined curvature suitable for compensating for diffraction of the laser beam.

The surface-emitting layer diode according to the present invention comprises a spacer between a p-type electrode and an active layer to effectively cause holes to migrate towards the active layer. In addition, a DBR layer is formed on a portion of the spacer in a shape suitable for compensating for diffraction caused by the spacer and for minimizing the radius of laser mode in the active layer. Thus, with the surface-emitting laser diode according to the present invention, holes as well as electrons can effectively be provided to the center of the active layer, and thus the current threshold for laser emission is reduced. Energy conversion efficiency becomes high, and the laser beam emitted by the surface-emitting laser diode has stable transverse mode characteristics.

BRIEF DESCRIPTION OF THE DRAWINGS

The above objects and advantages of the present invention will become more apparent by describing in detail preferred embodiments thereof with reference to the attached drawings in which:

FIGS. 4 and 5 are diagrams illustrating calculation of the radius of curvature of a laser output window suitable for compensating for diffraction caused by a spacer of the GaN series surface-emitting laser diode according to the present invention, in which FIG. 4 shows the geometric relation between the spacer thickness, the radius of curvature of the laser output window, the radius (W) of laser mode at the laser output window, and the radius ($W_0$) of laser mode at an active layer, and FIG. 5 is a graph of the radius (W) of laser mode at the surface of the laser output window versus the thickness of the spacer;

DETAILED DESCRIPTION OF THE INVENTION

Figure 1:
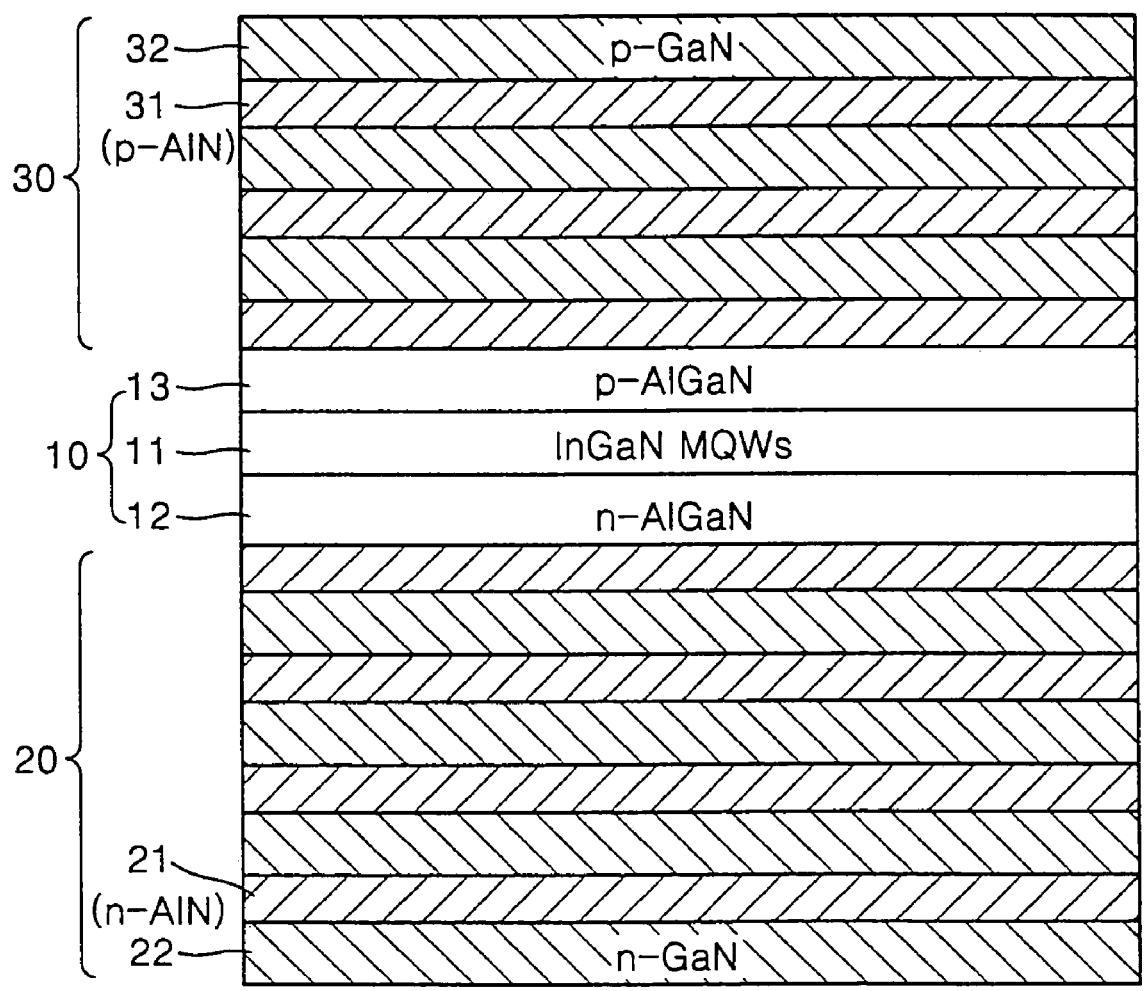
FIG. 1 is a sectional view of a conventional GaN series surface-emitting laser diode.

A GaN series surface-emitting laser diode having a spacer between a p-type electrode and an active layer for effective hole diffusion and a method for manufacturing the same will be described more fully with reference to the accompanying drawings, in which preferred embodiments of the invention are shown. In the drawings, the thickness of layers and regions are exaggerated for clarity. For convenience of explanation, the surfaces of the active layers are referred to as "first surface" and "second surface", the first surface contacting a first material layer for lasing and the second surface contacting a second material layer for lasing.

Preferred embodiments of the GaN series surface-emitting laser diode according to the present invention now will be described.

<Embodiment 1>

Figure 2:
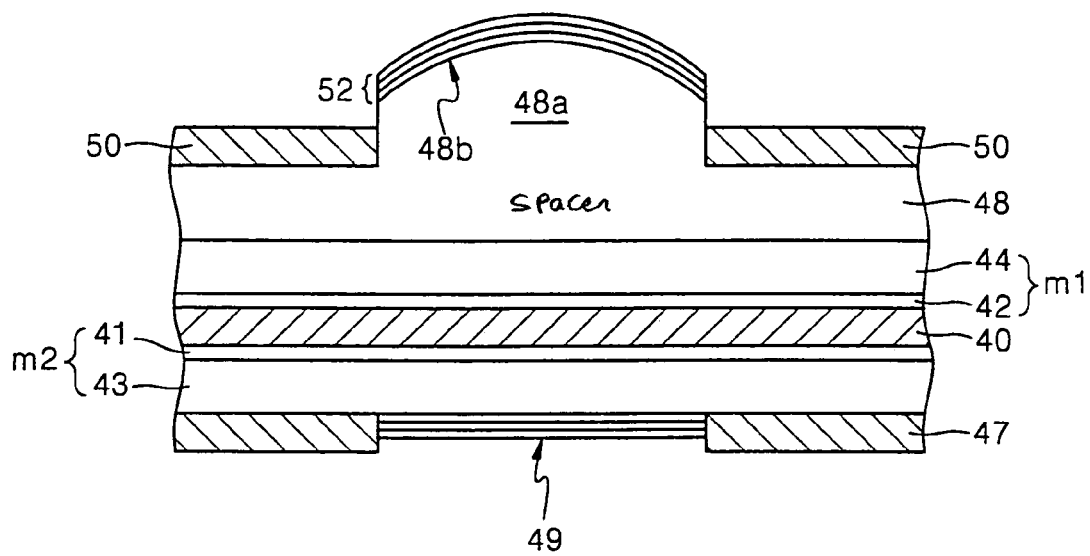
FIG. 2 is a sectional view of a first embodiment of a GaN series surface-emitting laser diode according to the present invention.

Referring to FIG. 2, a surface-emitting laser diode according to the first embodiment of the present invention includes an active layer 40 in which lasing occurs with application of a voltage, and p-type and n-type material layers m1 and m2 formed around the active layer 40 facing each other. The n-type material layer m2 includes a n-type barrier layer 41 formed underneath the active layer 40 and an n-type compound semiconductor layer 43 formed underneath the n-type barrier layer 41. The n-type barrier layer 41 is preferably formed of a material layer having a bandgap smaller than that of the n-type compound material layer 43 and larger than that of the active layer 40. For example, the n-type barrier layer 41 may be an n-type doped conductive compound semiconductor layer, and preferably, an n-$Al_xGa_{1-x}N$ layer containing a predetermined ratio of Al. The n-type compound material layer 43 may be an n-type doped conductive compound semiconductor layer, and preferably, an n-$Al_xGa_{1-x}N$ layer. Alternatively, the n-type barrier layer 41 and the n-type compound semiconductor layer 43 may be formed of undoped material layers.

The active layer 40 is a material layer in which lasing occurs and thus it is formed of, preferably, a lasing-capable material layer. More preferably, the active layer 40 is formed of a GaN series III-V nitride compound semiconductor layer having a multi-quantum well (MQW) structure.

The p-type material layer m1 for lasing includes a plurality of compound semiconductor layers, for example, a p-type barrier layer 42 formed on the active layer 40 and a p-type compound semiconductor layer 44 formed on the p-type barrier layer 42. The p-type barrier layer 42 may be formed of the same material layer as that of the n-type barrier layer 41, but with conductive dopant providing for opposite electrical characteristics to those of the n-type barrier layer 42. Likewise, the p-type compound semiconductor layer 44 may be formed of the same material layer as that of the n-type compound semiconductor layer 43, but with conductive dopant providing for opposite electrical characteristics to those of the n-type compound semiconductor layer 43. Alternatively, the p-type barrier layer 42 and the p-type compound semiconductor layer 43 may be formed of undoped material layers.

An n-type electrode 47 is formed underneath a portion of the n-type compound semiconductor layer 43 of the n-type material layer m2, and a first distributed Bragg reflector (DBR) layer 49 is formed underneath the remaining portion of the n-type compound semiconductor layer 43. The n-type electrode 47 may have a variety of shapes, and preferably, has a symmetrical shape around the first DBR layer 49 by considering uniform carrier injection in all directions. Although not apparent in FIG. 2, more preferably, the n-type electrode 47 has an annular shape. The first DBR layer 49 as a material layer having a high reflectivity of about 99% is formed of multiple dielectric material layers having a predetermined dielectric constant, for example, including $SiO_2$, $AlO_3$, $TiO_2$, and $ZnO_2$.

A spacer 48, and preferably, a p-type spacer, is formed on the p-type compound semiconductor layer 44 of the p-type material layer m1. The spacer 48 is a material layer for effectively supplying carriers, i.e., holes, into the center of the active layer 40, and is formed of a material layer updoped or doped with p-type conductive impurity. The spacer 48 is formed to be thick enough for an excess of holes to reach the center of the laser, i.e., the active layer 40, with the application of lasing voltage.

The spacer 48 has a protrusion portion 48a aligned with the first DBR layer 49. A laser output window 48b is formed on the surface of the protrusion portion 48a. A p-type electrode 50 is formed around the protrusion portion 48a. The p-type electrode 50, which induces migration of holes toward the active layer 40 when forward voltage is applied, is formed around the protrusion portion 48a. The p-type electrode 50 preferably has the same shape as the n-type electrode 47.

The spacer 48 is effective in diffusing an excess of holes into the center of the active layer 40, but may degrade laser oscillation characteristics of the active layer 40. For this reason, it is preferable that the laser output window 48b has a shape suitable for compensating for the laser characteristic degradation. For example, the laser output window 48b may have a lens shape, e.g., a convex lens shape having curvature such that laser light diffraction caused by the spacer 48 is offset or the radius of the laser mode is minimized at the center of the active layer 40.

The laser output window 48b is capped by a second DBR layer 52. Like the first DBR layer 49, the second DBR layer 52 is formed of a high-reflectivity material layer including multiple dielectric layers having a predetermined dielectric constant.

Figure 4:
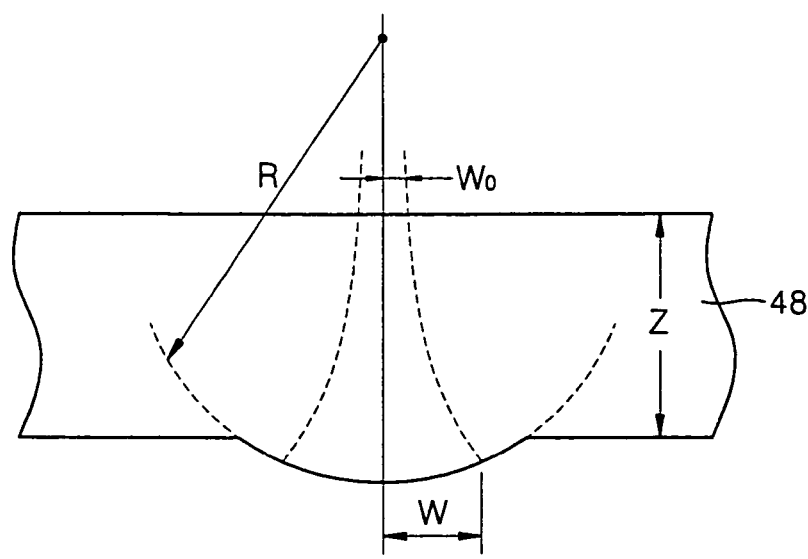
Figure 5:
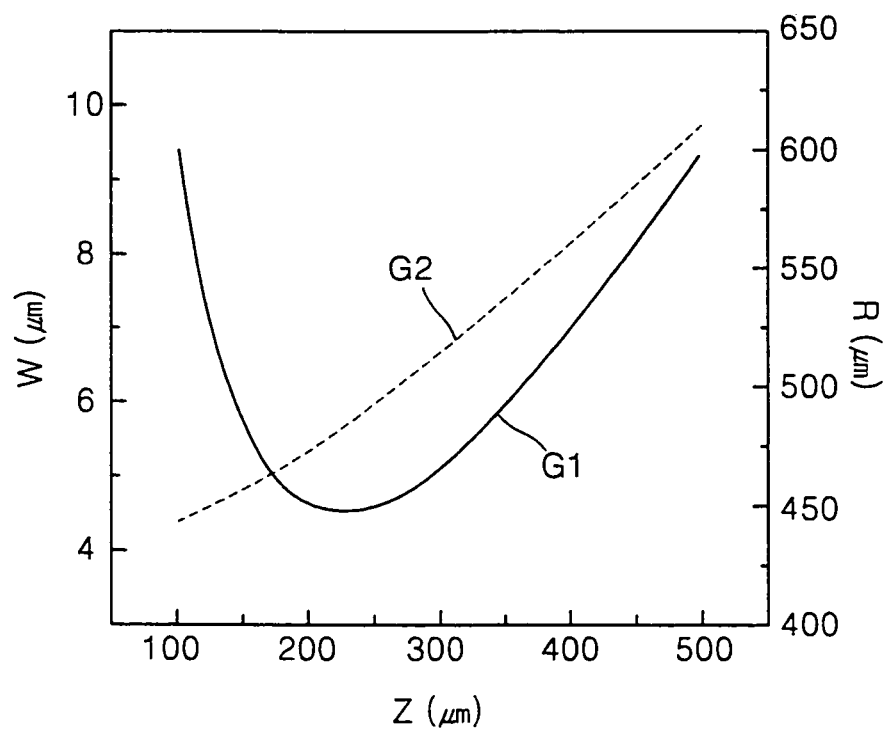
Figure 6:
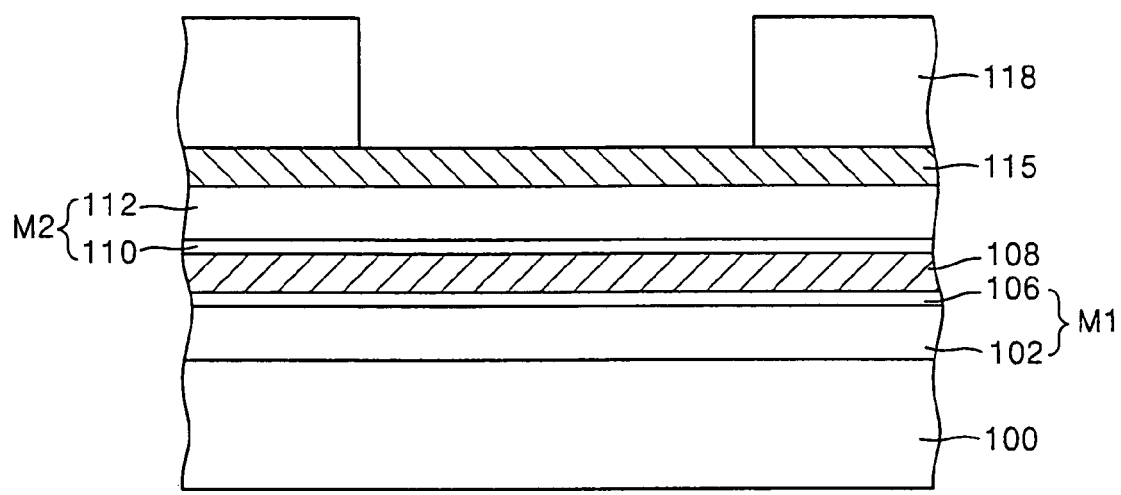
FIGS. 6 through 13 are sectional views illustrating each step of a method for manufacturing a GaN series surface-emitting laser diode according to a first embodiment of the present invention.

Preferred shapes of the laser output window 48b are shown in FIGS. 4 and 5. FIG. 4 shows the relation between the radius (R) of curvature of the laser output window 48b, the radius (W) of the laser mode on the surface of the laser output window 48b, the radius ($W_0$) of the laser mode in the active layer 40, and the thickness (Z) of the spacer 48. In FIG. 5, graphs G1 and G2 show variation in the radius (W) of the laser mode on the surface of the laser output window 48b and the radius (R) of curvature of the laser output window 48b with respect to thickness (Z) of the spacer 48. As shown in FIG. 5, the radius (W) of the laser mode on the surface of the laser output window 48b becomes smaller with reduced thickness (Z) of the spacer 48, and the radius (R) of curvature of the laser output window 48b is the smallest at a spacer thickness (Z) in the range of 200–250 $\mu$m. The spacer thickness (Z) and the radius (R) of curvature of the laser output window 48b, at which the radius ($W_0$) of the laser mode in the active layer 40 becomes least, can be calculated with reference FIGS. 4 and 5.

<Embodiment 2>

Figure 3:
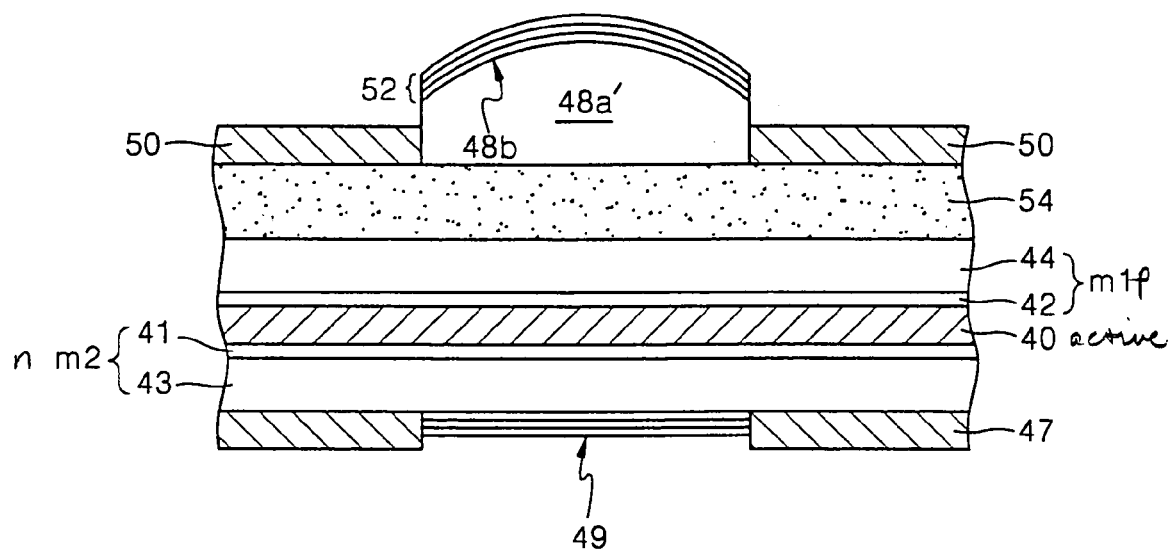
FIG. 3 is a sectional view of a second embodiment of the GaN base surface-emitting laser according to the present invention.

A second embodiment of the GaN series surface-emitting laser according to the present invention is shown in FIG. 3. Referring to FIG. 3, a p-type spacer 54 is formed on the p-type material layer m1 and a separate protrusion portion 48a', which has the same shape as the protrusion portion 48a of the first embodiment, is formed on the p-type spacer 54 aligned with the first DBR layer 49. The p-type electrode 50 is formed on the p-type spacer 54 to surround the protrusion portion 48a'.

Preferred embodiments of a method for manufacturing a surface-emitting laser diode having a structure as described above now will be described.

<Embodiment 1>

FIGS. 6 through 13 are sectional views illustrating each step of a method for manufacturing a GaN series surface-emitting laser diode according to a first embodiment of the present invention. First, referring to FIG. 6, a p-type compound semiconductor layer 102 and a p-type barrier layer 106 for carrier confinement are sequentially formed on a p-type substrate 100, resulting in a p-type material layer M1 for lasing. An active layer 108 is formed on the p-type barrier layer 106. An n-type barrier layer 110 and an n-type compound semiconductor layer 112 are sequentially formed on the active layer 108, resulting in an n-type material layer M2 for lasing. The p-type and n-type material layers M1 and M2 are the same as the p-type and n-type material layers m1 and m2 described with reference to FIG. 2. The active layer 108 is also the same material layer as the active layer 40 of FIG. 2. Thus, descriptions of these layers will not be provided hear.

Next, a conductive layer 115 is formed on the n-type material layer M2 and a mask pattern 118 is formed to expose a region of the conductive layer 115 to be a first DBR layer. The mask pattern 118 may be formed of a soft mask pattern such as a photoresistive pattern or a hard mask pattern such as a silicon nitride or nickel pattern.

Figure 7:
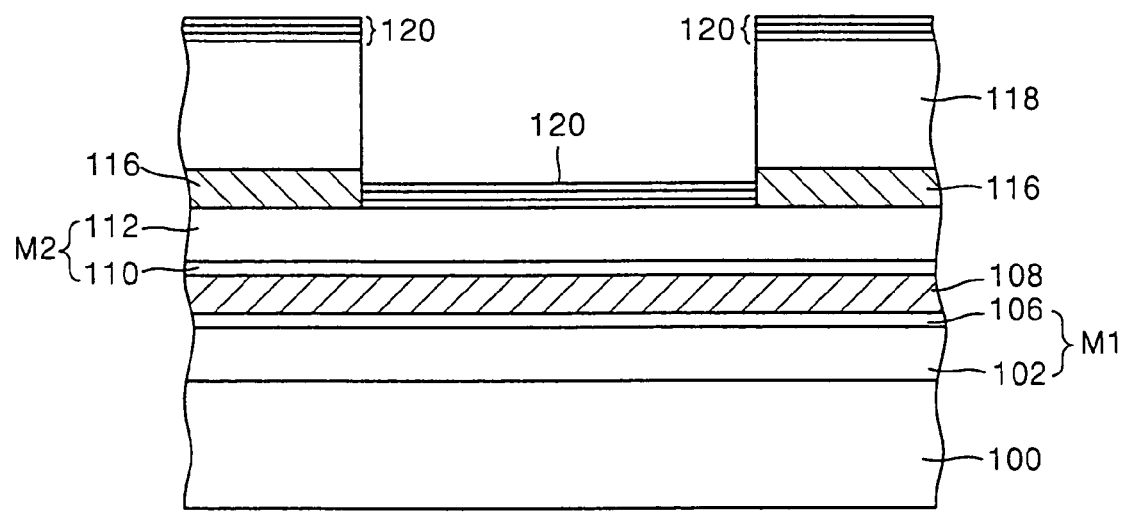

Referring to FIG. 7, the exposed region of the conductive layer 115 is etched using the mask pattern 118 as an etch mask, thereby forming a conductive pattern 116 (hereinafter, referred to as "n-type electrode") on the n-type material layer M2. The n-type electrode 116 may have various forms. The n-type electrode 116 is preferably formed to be symmetrical at the center of the exposed region by considering migration of carriers (electrons). For example, the n-type electrode 116 may be formed in an annular shape. A first DBR layer 120 is formed in an exposed region of the n-type material layer M2 excluding the region of the n-type electrode 116. Here, the first DBR layer 120 is also formed on the mask pattern 118. The first DBR layer 120 is the same as the first DBR layer 29 of FIG. 2 and thus a description thereof is not provided here. Next, the mask pattern 118 is removed along with the first DBR layer 29 formed thereon. A chemical used for removing the mask pattern 118, which is different from a chemical used for removing the first DBR layer 120, does not affect the first DBR layer 120 formed on the n-type material layer M2 during the removal process. As a result, the n-type electrodes 116 and the first DBR layer 120 are formed on the n-type material layer M2.

Figure 8:
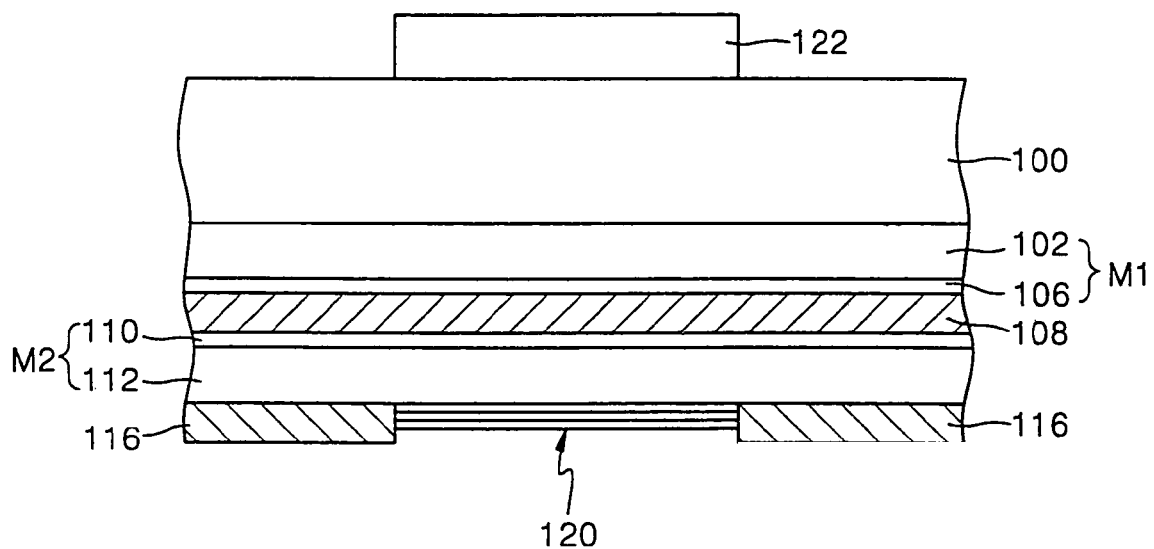
Figure 9:
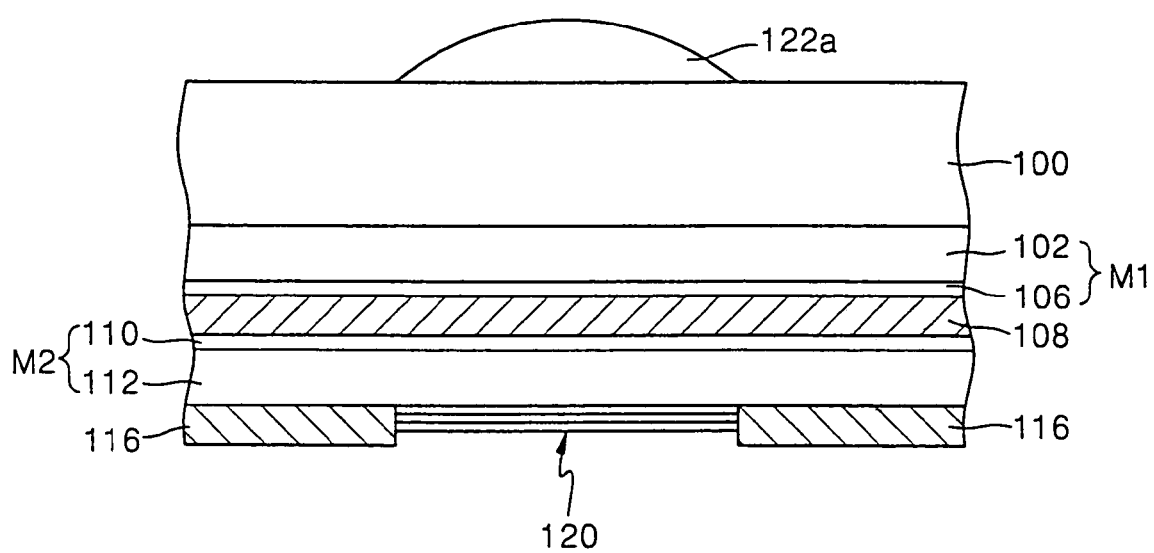

Referring to FIG. 8, after inverting the resultant structure having the first DBR layer 120 and the n-type electrode 116, a mask pattern 122 is formed on a bottom surface of the p-type substrate 100 aligned with the first DBR layer 120. The mask pattern 122 is formed of the same material layer used for the mask pattern 118 of FIG. 6. The mask pattern 122 will be reflowed into a lens shape, as shown in FIG. 9. For this reason, a soft mask pattern is preferred to a hard mask pattern as the mask pattern 122. The mask pattern 122 is etched along with the p-type substrate 100 in a following process such that the shape of the mask pattern 122 is transferred to the p-type substrate 100. Thus, it is preferable that the mask pattern 122 has an etching selectivity not smaller than that of the p-type substrate 100, i.e., similar or equal to that of the p-type substrate 100.

Figure 10:
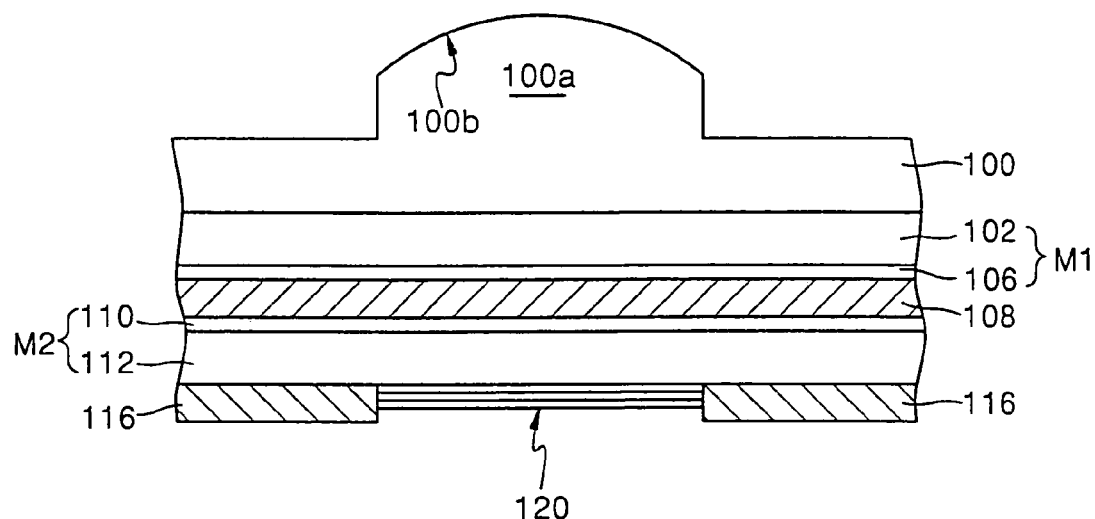

Next, the mask pattern 122 is reflowed at a predetermined temperature into a convex lens-shaped mask pattern 122a having a predetermined curvature, as shown in FIG. 9. An exposed region of the p-type substrate 100 is etched using the lens-shaped mask pattern 122a as an etch mask, resulting in a lens surface having the same curvature as that of the lens-shaped mask pattern 122a in the p-type substrate 100. As a result, a laser output window 100b through which a laser beam generated from the active layer 108 is emitted to the outside, is formed on the bottom surface of the p-type substrate 100, as shown in FIG. 10. Here, the surface of the laser output window 100b has the same curvature as that of the lens-shaped mask pattern 122a. Although an electrode can be formed around the laser output window 100b, it is preferable that the etching with the lens-shaped mask pattern 122a is performed until the exposed region of the p-type substrate 100 is removed by a predetermined thickness to form a protrusion portion 100a, and then an electrode is formed around the protrusion portion 100a.

Figure 11:
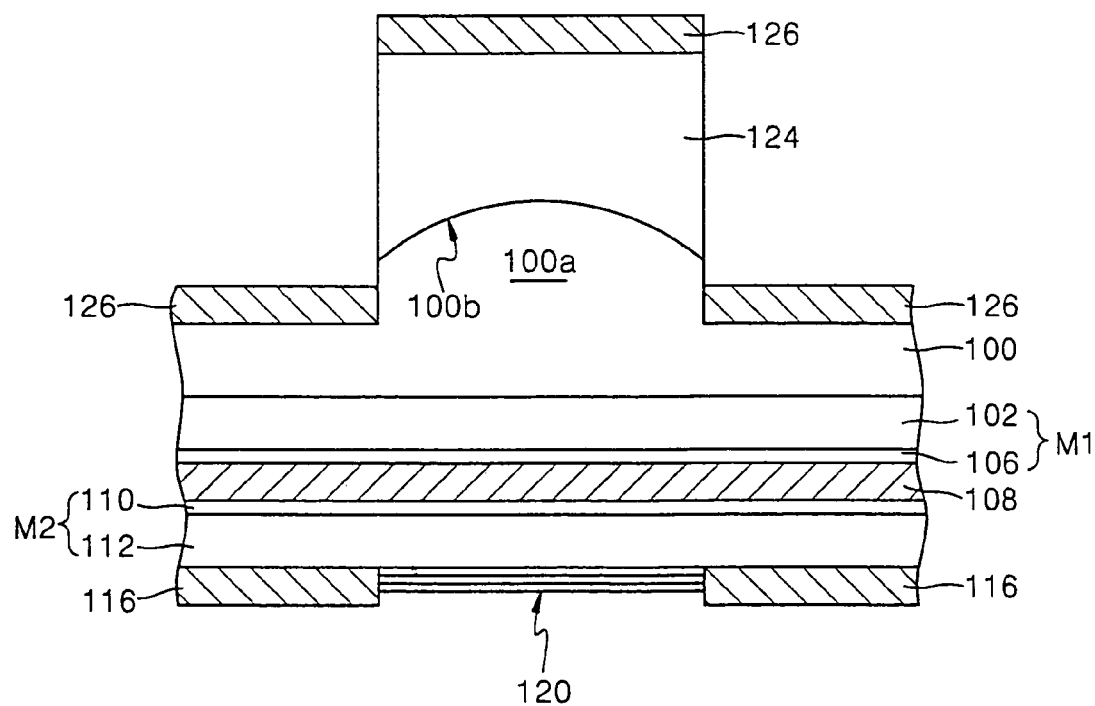

In particular, as shown in FIG. 11, a mask pattern 124 is formed on the entire surface of the protrusion portion 100a. A conductive layer 126 is formed on the p-type substrate 100 around the protrusion portion 100a covered by the mask pattern 124 and also on the mask pattern 124. The conductive layer 126 which is formed on the mask pattern 124 is removed during removal of the mask pattern 124. The conductive layer 126 which is formed on the p-type substrate 100 around the protrusion portion 100a is unaffected during the removal of the mask pattern 124 for the reason described above. As a result, only the conductive pattern 126 formed on the p-type substrate 100 remains around the sidewall of the protrusion portion 100a. The remaining conductive layer 126 serves as a p-type electrode. Like the n-type electrode 116, the p-type electrode 126 may have various forms as long as voltage can be applied. Preferably, the p-type electrode 126 is formed to have a symmetrical shape like the n-type electrode 116. More preferably, the p-type electrode 126 is formed in the same annular shape as the n-type electrode 116.

Figure 12:
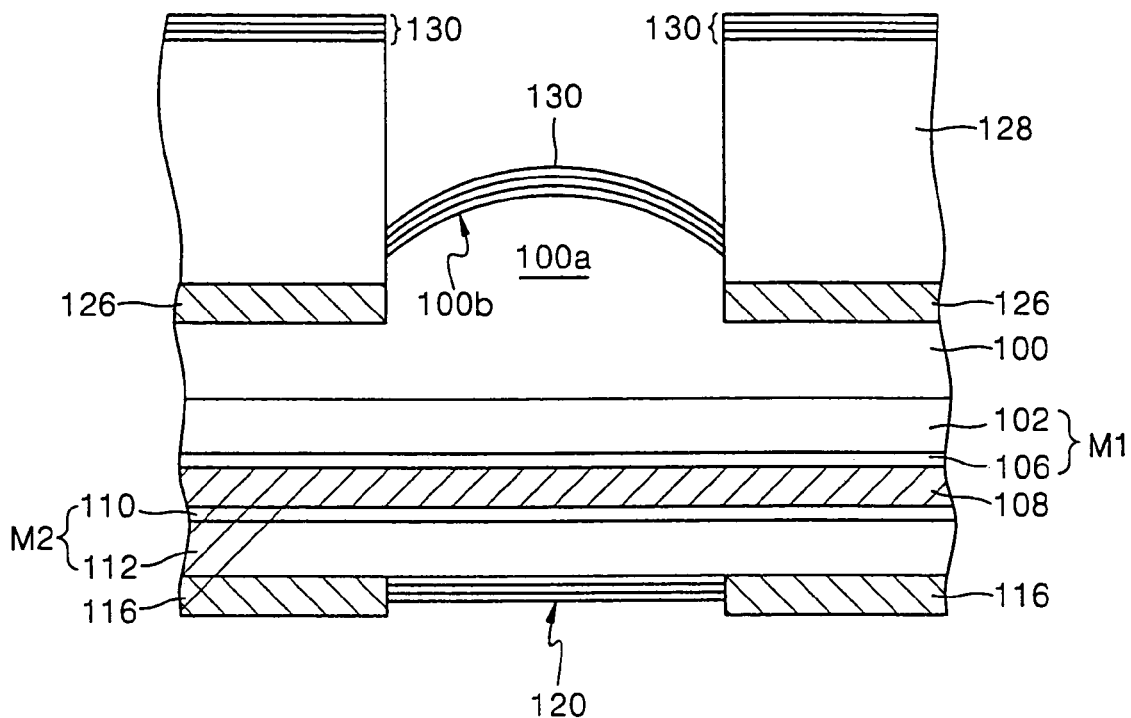
Figure 13:
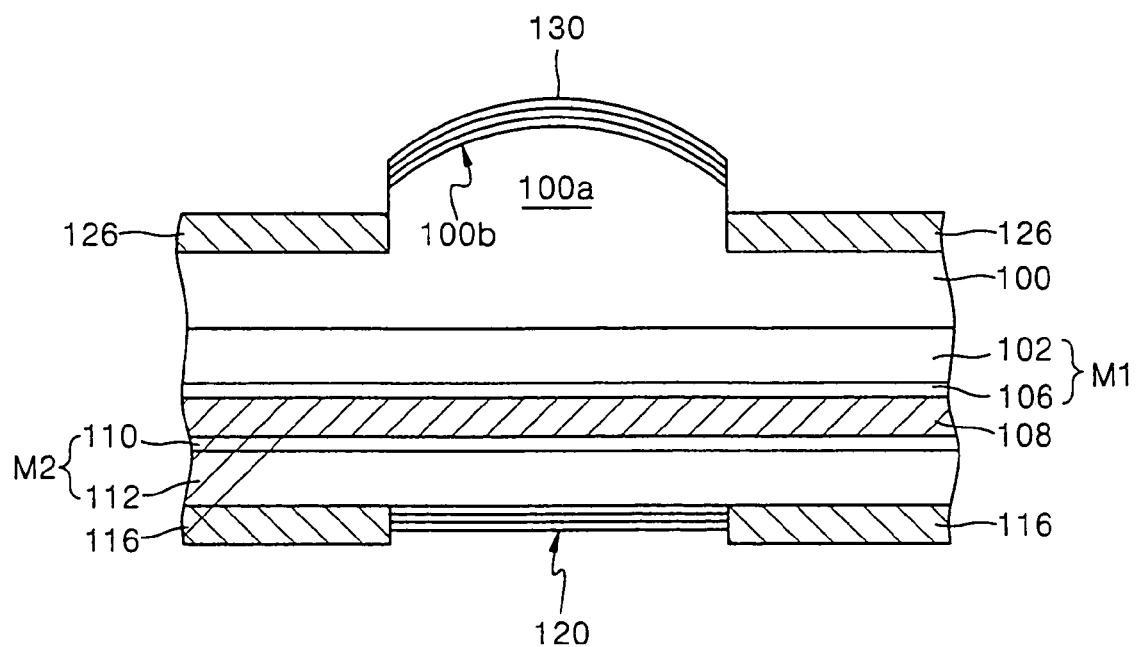

As shown in FIG. 12, a mask layer (not shown) is deposited on the resultant structure in which the p-type electrode 126 is formed, and then patterned into a mask pattern 128 covering the p-type electrode 126 and exposing the protrusion portion 100a around which the p-type electrode 126 is formed. A second DBR layer 130 is formed on the top of the protrusion portion 100a and on the mask pattern 128. The second DBR layer 130 is the same as the second DBR layer 52 of FIG. 2, and thus a description thereof is not provided here. The second DBR layer 130 formed on the mask pattern 128 is removed during removal of the mask pattern 128. The result, as shown in FIG. 13, is a surface-emitting laser diode in which the p-type substrate 100 interposed between the p-type electrode 126 and the active layer 108 serves as a spacer with the protrusion portion 100a having the lens-shaped top surface on which the second DBR layer 130 is formed, and the p-type electrode is formed around the protrusion portion 100a.

As described above, due to the p-type substrate 100 formed as a spacer between the p-type electrode 126 and the active layer 108, to be relatively thicker than other material layers of the laser diode, diffusion of holes to the center of the active layer 108 from the p-type electrode 126 is easy, and thus an excess of holes for laser emission can be provided to the center of the active layer 108. However, the characteristics of a laser emitted from the active layer 108 may degrade due to diffraction of the laser beam: For this reason, the laser output window 100b on the protrusion portion 100a is formed in an appropriate shape such that the drop in characteristics of the laser beam, which may occur due to the presence of the p-type substrate 100 serving as a p-type spacer, can be compensated for. In view of this, the laser output window 100b is formed on the top of the protrusion portion 100a in a convex lens-like shape having a predetermined curvature suitable for compensation of the degradation of laser beam quality. In other words, it is preferable that the laser output window 100b is designed to have a curvature suitable for guiding a laser beam being diffracted toward the center of the active layer 108.

<Embodiment 2>

Multiple substrates rather than a single substrate are used: a first substrate corresponding to a substrate 101 to be described below and a second substrate corresponding to a p-type spacer 140 formed on the substrate 101.

Figure 14:
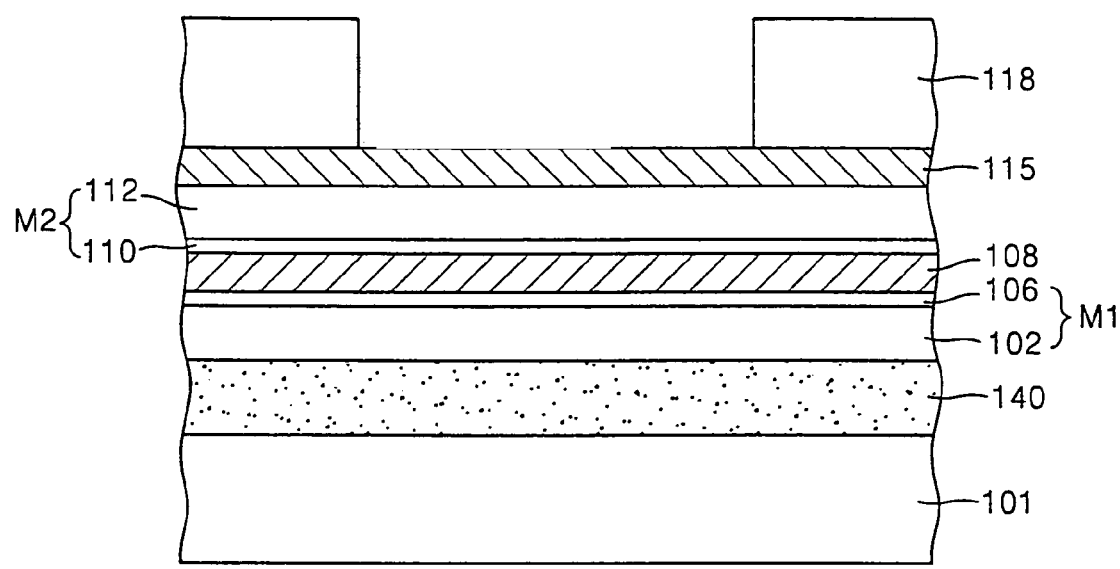
FIGS. 14 and 15 are sectional views illustrating steps of a method for manufacturing a GaN series surface-emitting laser diode according to a second embodiment of the present invention.
Figure 15:
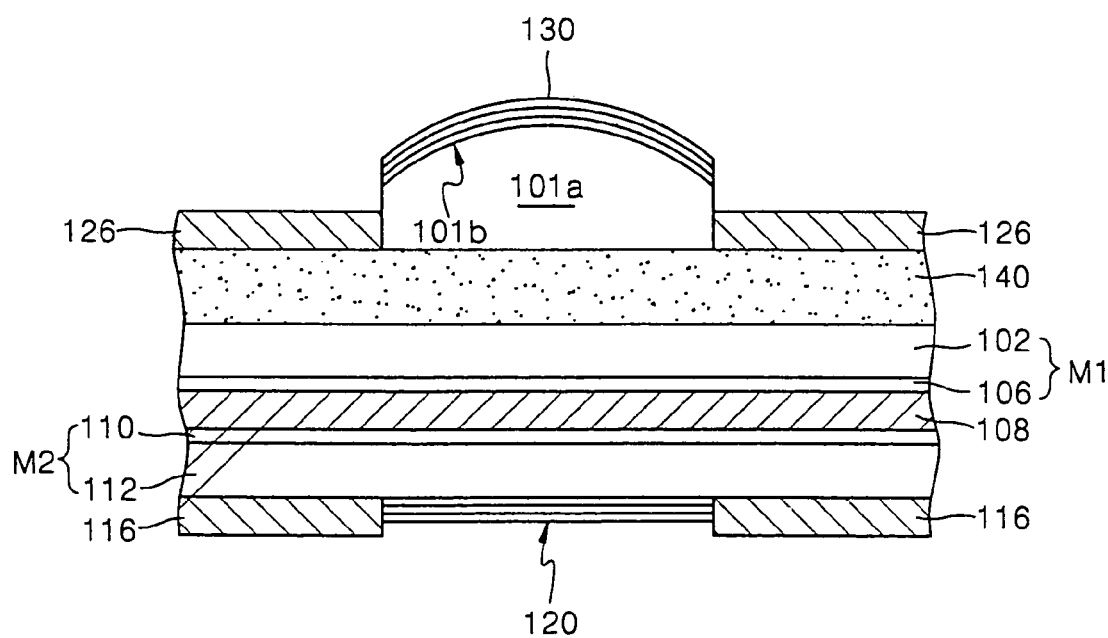

Referring to FIG. 14, the p-type spacer 140 is formed to be thick on the substrate 101. Here, the substrate 101 may be formed of a p-type substrate, but gallium nitride (GaN) or other GaN series materials are preferred as the substrate 101. For example, a sapphire substrate or a silicon carbide (SiC) substrate is preferably used. As a p-type material layer M1 for lasing, a p-type compound material layer 102 and a p-type barrier layer 106 for carrier confinement are formed on the p-type spacer 140. Here, the p-type spacer 140 may be included in the p-type material layer M1 for lasing. An active layer 108 is formed on the p-type barrier layer 106, and an n-type barrier layer 110 and an n-type compound semiconductor layer 112 are sequentially formed on the active layer 108, resulting in an n-type material layer M2. Following this, a conductive layer 115 is formed on the n-type compound semiconductor layer 112 in the same manner as in Embodiment 1 and patterned into an n-type electrode 116, as shown in FIG. 15, using an mask pattern 118. Next, a first DBR layer 120 is formed on an exposed portion of the n-type compound semiconductor layer 112.

After removing the mask pattern 118 and inverting the resultant structure, a protrusion portion 101a is formed on the bottom surface of the substrate 101 in the same manner as in Embodiment 1. In etching the substrate 101 to form the protrusion portion 101a, the etching is continued until the bottom of the p-type spacer 140 is partially exposed, resulting in the protrusion portion 101a as a substrate pattern with a laser output window 101b thereon. Next, a p-type electrode 126 and a second DBR layer 130 are formed in the same manner as in Embodiment 1.

<Embodiment 3>

In the present embodiment, a first DBR layer 120 is formed prior to formation of an n-type electrode 116.

Figure 16:
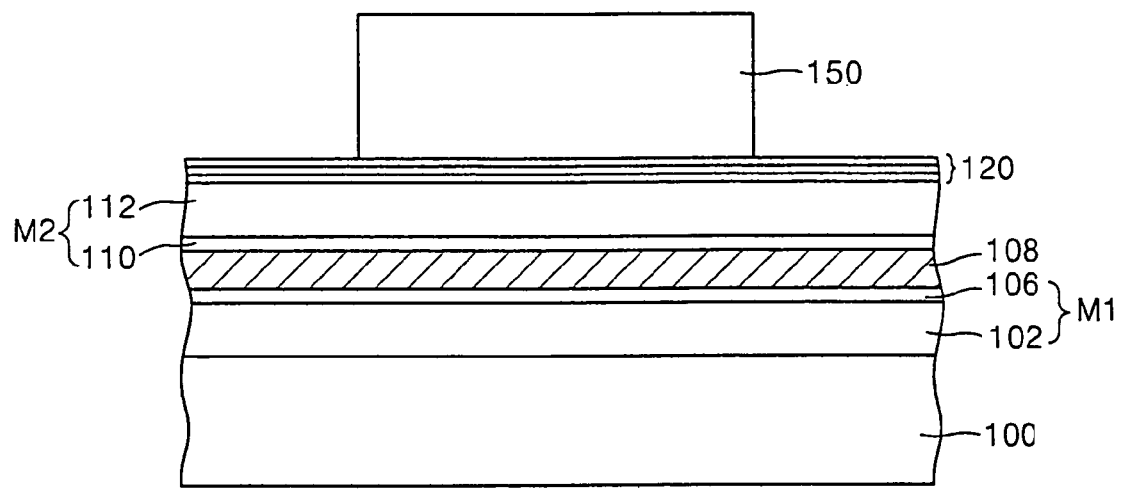
FIGS. 16 through 18 are sectional views illustrating steps of a method for manufacturing a GaN series surface-emitting laser diode according to a third embodiment of the present invention.

Referring to FIG. 16, the steps up to forming the n-type compound semiconductor material layer 122 are performed in the same manner as in Embodiment 1 or 2. Next, a first DBR layer 120 is formed on the n-type compound semiconductor layer 112. A mask pattern 150 is formed to cover a predetermined region of the first DBR 120. The mask pattern 150 is formed of a soft mask pattern or a hard mask pattern described above. A portion of the first DBR layer 120 exposed around the mask pattern 150 is removed using the mask pattern 150 as an etch mask.

Figure 17:
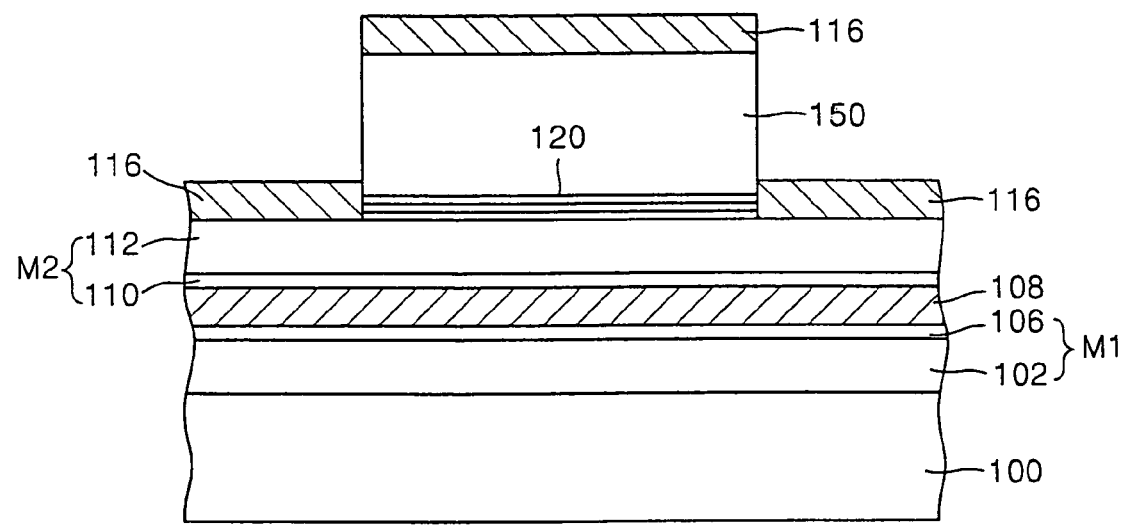
Figure 18:
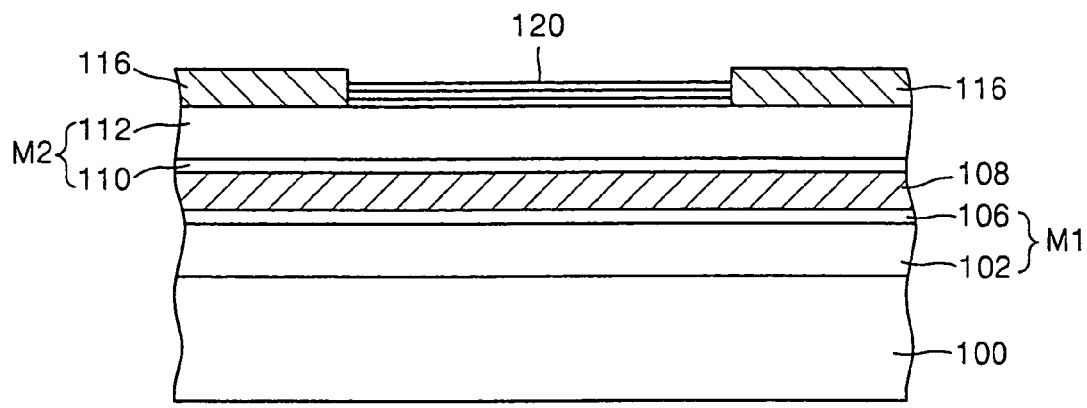

Referring to FIG. 17, a conductive layer 116 serving as an n-type electrode is formed on the n-type compound semiconductor layer 112 exposed around the mask pattern 150. The conductive layer 150 is removed along with the mask pattern 150 formed thereon. As a result, as shown in FIG. 18, the first DBR layer 120 and the n-type electrode 116 around the first DBR layer 120 are formed on the n-type compound semiconductor layer 112. The following steps are performed in the same manner as in Embodiment 1.

<Embodiment 4>

Figure 19:
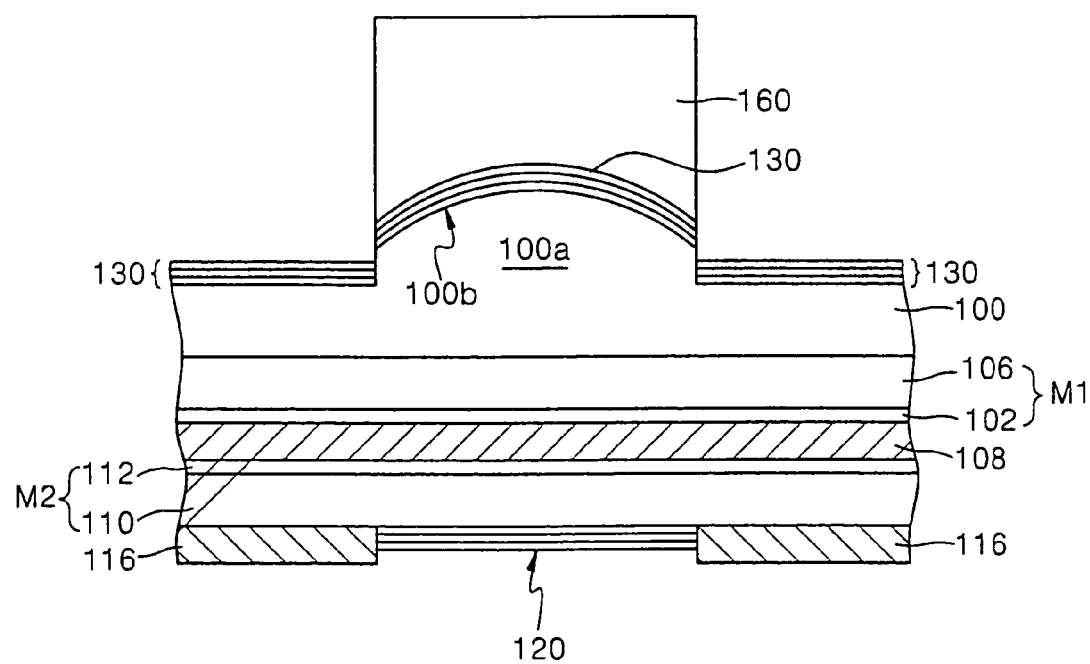
FIGS. 19 and 20 are sectional views illustrating steps of a method for manufacturing a GaN series surface-emitting laser diode according to a fourth embodiment of the present invention.

A second DBR layer 130 is formed prior to formation of a p-type electrode 126. Referring to FIG. 19, the steps up to forming a protrusion portion 100a with a laser output window 100b on the bottom surface of a p-type substrate 100 are performed in the same manner as in Embodiments 1 through 3. Next, a second DBR layer 130 is formed on the p-type substrate 100 having the laser output window 100b. A mask pattern 160 is formed to cover the second DBR layer 130 formed on the laser output window 100b. The mask pattern 160 is formed of a soft mask pattern or hard mask pattern. The second DBR layer 130 formed on a portion of the p-type substrate 100 surrounding the protrusion portion 100a is removed, exposing the portion of the p-type substrate 100.

Figure 20:
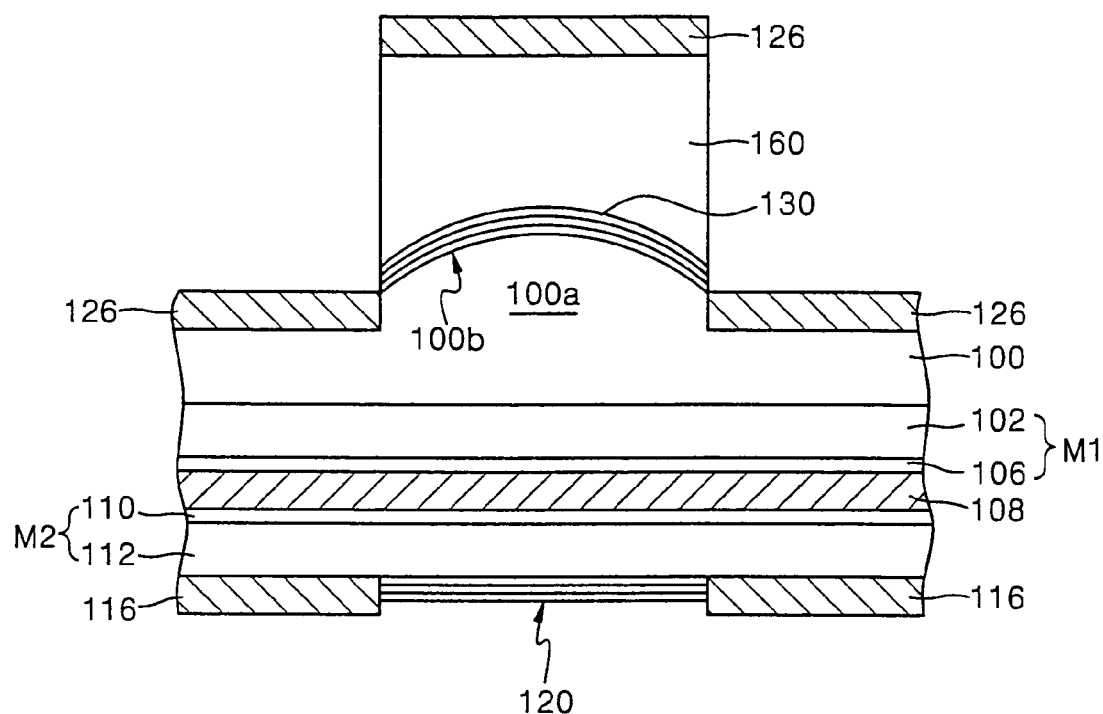

Following this, as shown in FIG. 20, a conductive layer 126 serving as a p-type electrode is formed on the exposed portion of the p-type substrate 100 around the protrusion portion 100a. At this time, the conductive layer 126 is also formed on the mask pattern 160, but it is removed along with the mask pattern 160. As a result, a surface-emitting laser diode which allows smooth migration of holes existing between the second DBR layer 130 and an active layer 108 toward the active layer 108 and can compensate for diffraction of a laser beam emitted from the active layer 108, is obtained.

<Embodiment 5>

Figure 21:
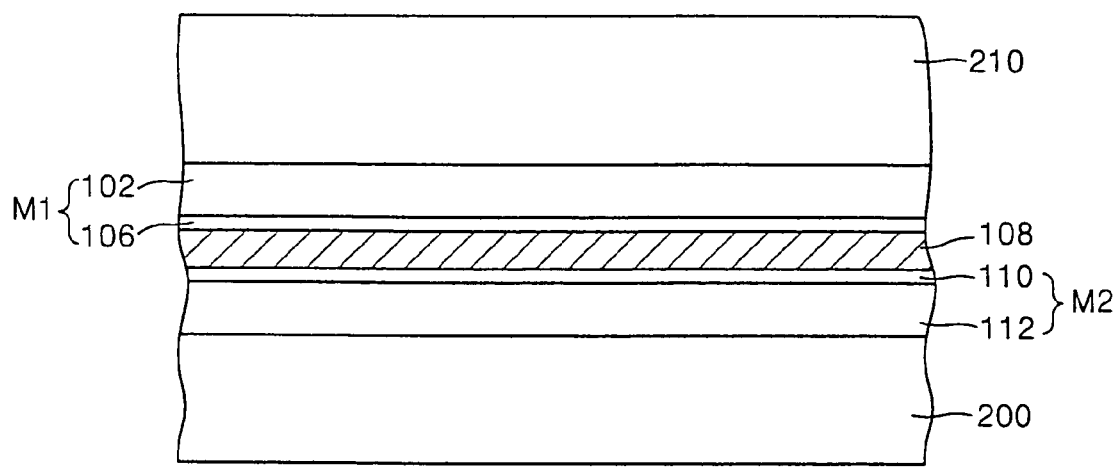
FIGS. 21 through 23 are sectional views illustrating steps of a method for manufacturing a GaN series surface-emitting laser diode according to a fifth embodiment of the present invention.

Referring to FIG. 21, an n-type material layer M2, an active layer 108, and a p-type material layer M1 are sequentially formed on a substrate 200. The substrate 200 is a high-resistance substrate, such as an n-type substrate or a sapphire substrate. Alternatively, the substrate 100 may be an undoped substrate. Next, a p-type spacer 210 is formed on the p-type material layer M1.

Figure 22:
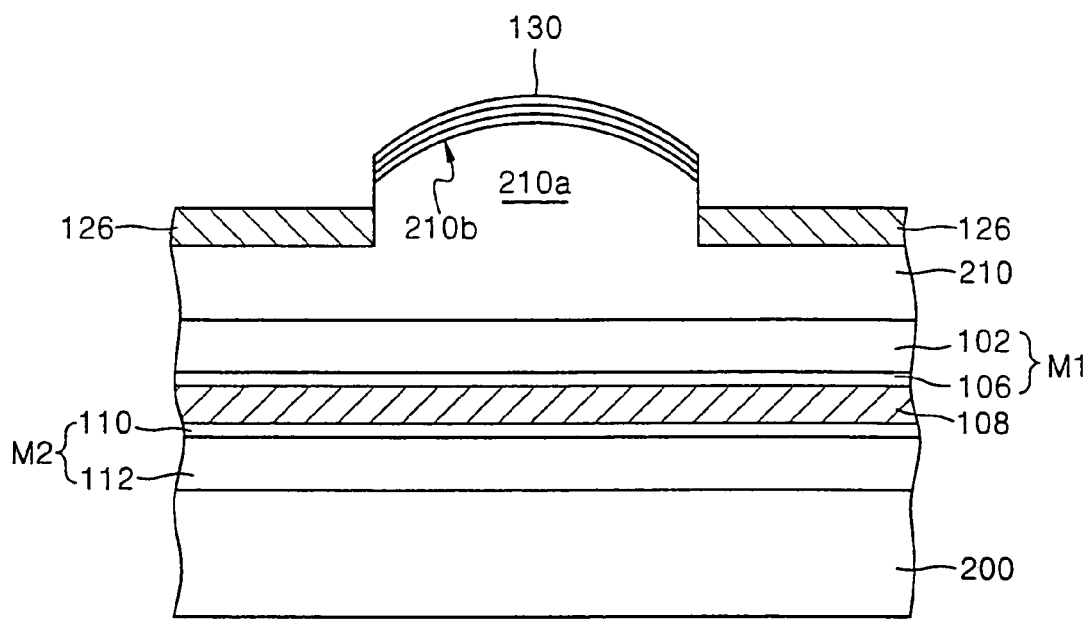

Referring to FIG. 22, the p-type spacer 210 is patterned into a protrusion portion 210a in the same manner as in Embodiment 1 or 2. A laser output window 210b is formed on the protrusion portion 210a. A second DBR layer 130 is formed on the laser output window 210b, and a p-type electrode 126 is formed on the p-type spacer 210 to surround the protrusion portion 210a.

Figure 23:
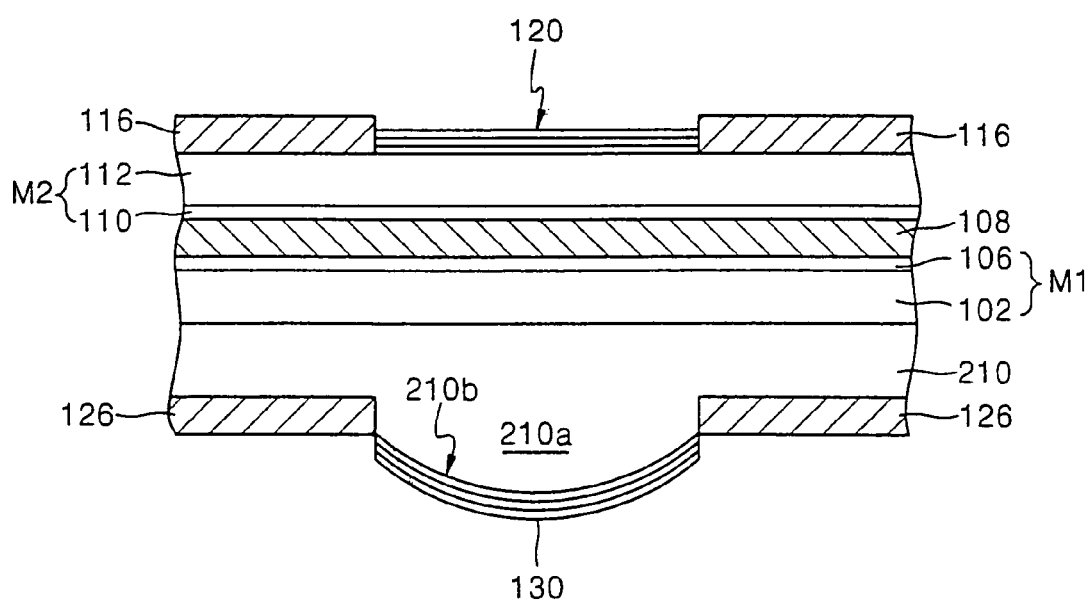

The resultant structure, on which the p-type electrode 126 is formed, is inverted, and the substrate 200 is removed from the structure. As shown in FIG. 23, a first DBR layer 120 is formed on the n-type compound semiconductor layer 112, and a n-type electrode 116 is formed to surround the first DBR layer 120 formed on the n-type compound semiconductor layer 112.

The present invention may be embodied in many different forms, and the embodiments described herein are merely illustrative and not intended to limit the scope of the invention. For example, it will be appreciated to those skilled in that art that the spacer can be applied to a surface-emitting laser diode whose laser output window is not a convex lens-like shape. Alternatively, a surface-emitting laser diode may be constructed such that a spacer is formed in any positions between the active layer and the p-type electrode, and a laser output window, which has a predetermined curvature and around which the p-type electrode is formed, is formed without a protrusion portion. The structures of the first and second material layers, or materials used for the same may be varied from the embodiments described above. In another surface-emitting laser diode, the DBR layers may be formed by air gap.

As described above, the present invention provides a surface-emitting laser diode including a spacer formed between a p-type electrode and an active layer to enable the effective migration of holes to the center of the active layer, a laser output window designed in a particular shape on a portion of the spacer such that diffraction of a laser beam caused by the formation of the spacer can be compensated for or the radius of the laser mode in the active layer can be minimized, and a DBR layer on the surface of the laser output window. With the surface-emitting laser diode according to the present invention, holes as well as electrons can effectively be provided to the center of the active layer, and thus emission of a laser beam is achieved with reduced current. Energy conversion efficiency becomes high, and the laser beam emitted by the surface-emitting laser diode has stable transverse mode characteristics.

While this invention has been particularly shown and described with reference to preferred embodiments thereof, it will be understood by those skilled in the art that various changes in form and details may be made therein without departing from the sprit and scope of the invention as defined by the appended claims.

What is claimed is:

1. A method for manufacturing a surface-emitting laser diode, the method comprising the steps of:
   (a) sequentially forming a p-type material layer for lasing, an active layer, and an n-type material layer for lasing on a substrate;

(b) forming a first distributed Bragg reflector (DBR) on the n-type material layer, around which an n-type electrode is formed;

(c) forming a laser output window on a bottom surface of the substrate, the laser output window having a shape suitable for compensating for a drop in characteristics of a laser beam caused by the presence of the substrate;

(d) forming a p-type electrode on the bottom surface of the substrate to surround the laser output window; and (e) forming a second DBR layer on the laser output window.

2. The method of claim 1, wherein step (b) comprises:

forming a conductive layer on the n-type material layer;

forming a mask pattern on the conductive layer to expose a portion of the conductive layer in which the first DBR layer is to be formed;

removing the portion of the conductive layer which is exposed through the mask pattern, using the mask pattern as an etch mask;

forming the first DBR layer on a portion of the n-type material layer from which the conductive layer is removed; and removing the mask pattern.

3. The method of claim 1, wherein step (b) comprises:

forming the first DBR layer on the n-type material layer;

forming a mask pattern on the first DBR layer to expose a portion of the first DBR layer, in which the n-type electrode is to be formed;

removing the portion of the first DBR layer which is exposed through the mask pattern, using the mask pattern as an etch mask;

forming a conductive layer on a portion of the n-type material layer, from which the first DBR layer is removed; and removing the mask pattern.

4. The method of claim 1, wherein step (c) comprises:

polishing the bottom surface of the substrate;

forming a mask pattern to cover a portion of the polished bottom surface of the substrate in which the laser output window is to be formed;

processing the mask pattern into a shape suitable for compensating for diffraction of the laser beam caused by the presence of the substrate; and etching the bottom surface of the substrate on which the processed mask pattern is formed, by a predetermined thickness, to transfer the shape of the processed mask pattern to the bottom surface of the substrate.

5. The method of claim 1, wherein, in step (c), the laser output window is formed in a convex lens-like shape having a predetermined curvature suitable for compensating for diffraction of the laser beam.

6. The method of claim 4, wherein, in processing the mask pattern, the mask pattern is processed into a convex lens-like shape by reflowing, the convex lens-like shape having a predetermined curvature suitable for compensating for diffraction of the laser beam.

7. The method of claim 4, wherein the substrate is formed of multiple layers including a first substrate and a second substrate on the first substrate.

8. The method of claim 7, wherein etching the bottom surface of the substrate on which the processed mask pattern is formed is continued until the second substrate is exposed.

9. The method of claim 1, wherein the substrate is a p-type doped substrate or an undoped substrate.

10. The method of claim 7, wherein one of the first and second substrates is a p-type doped substrate or an undoped substrate.

11. The method of claim 7, wherein the first substrate is formed as a substrate on which a gallium nitride based material is grown and the second substrate is formed as a p-type spacer.

12. A method for manufacturing a surface-emitting laser diode, the method comprising the steps of:

(a) sequentially forming on a substrate an n-type material layer for lasing, an active layer, a p-type material layer for lasing, and a p-type spacer;

(b) forming a laser output window in a predetermined area of the p-type spacer;

(c) forming a p-type electrode on the p-type spacer to surround the laser output window;

(d) forming a first distributed Bragg reflector (DBR) layer on the laser output window;

(e) removing the substrate; and (f) forming a second DBR layer on a predetermined portion of a bottom surface of the n-type material layer and forming an n-type electrode around the second DBR layer.

13. The method of claim 12, wherein the substrate is formed of an n-type substrate or a sapphire substrate and a gallium nitride based material is grown thereon.

14. The method of claim 12, wherein step (b) comprises:

forming a mask pattern to cover a portion of the p-type spacer in which the laser output window is to be formed;

processing the mask pattern into a shape suitable for compensating for diffraction of a laser beam caused by the presence of the p-type substrate; and etching the entire surface of the p-type spacer on which the processed mask pattern is formed, by a predetermined thickness, to transfer the shape of the processed mask pattern to the p-type spacer.

15. The method of claim 14, wherein the laser output window is formed in a convex lens-like shape having a predetermined curvature suitable for compensating for diffraction of the laser beam.

16. The method of claim 14, wherein, in processing the mask pattern, the mask pattern is processed into a lens-like shape by reflowing, the lens-like shape having a predetermined curvature suitable for compensating for the diffraction of the laser beam.

17. The method of claim 4, wherein the substrate is a p-type doped substrate or an undoped substrate.

* * * * *